United States Patent [19]
Dutta

[11] Patent Number: 5,454,007
[45] Date of Patent: Sep. 26, 1995

[54] ARRANGEMENT FOR AND METHOD OF CONCURRENT QUADRATURE DOWNCONVERSION INPUT SAMPLING OF A BANDPASS SIGNAL

[75] Inventor: Santanu Dutta, Cedar Rapids, Iowa

[73] Assignee: Rockwell International Corporation, Seal Beach, Calif.

[21] Appl. No.: 126,847

[22] Filed: Sep. 24, 1993

[51] Int. Cl.$^6$ .............................. H03D 3/00; H03K 9/06
[52] U.S. Cl. .............................................. 375/322; 329/341
[58] Field of Search ....................................... 329/341, 342, 329/343; 375/75, 78; 455/205, 324

[56] References Cited

U.S. PATENT DOCUMENTS

4,888,557  12/1989  Puckette, IV et al. ................. 329/341

Primary Examiner—Stephen Chin
Assistant Examiner—William Luther
Attorney, Agent, or Firm—Gregory G. Williams; M. Lee Murrah; George A. Montanye

[57] ABSTRACT

An arrangement for generating a digital, downconverted complex baseband signal from a bandpass signal comprises a signal source for providing first and second clock signals at first and second clocking rates, respectively. The first clocking rate is at four times the expected center frequency of the bandpass signal, and the second clocking rate is at an exact subharmonic frequency of the bandpass frequency. The bandpass signal is sampled by a composite sampling event of two sampling pulses which occur once during each period of the second clocking signals and which are time-spaced from each other by the inverse of the first clocking rate. The complex baseband samples are ready as an A/D converter output, with no requirement for DSP processing to complete the downconversion to zero-IF.

15 Claims, 8 Drawing Sheets

FIG. 11a  1.8 MHZ CLOCK
FIG. 11b  6 KHZ CLOCK
FIG. 11c  Q1 (I WRITE)
FIG. 11d  Q2 (Q WRITE)
FIG. 11e  $\overline{Q2}$ (DSP INT)

FIG. 12

ARRANGEMENT FOR AND METHOD OF CONCURRENT QUADRATURE DOWNCONVERSION INPUT SAMPLING OF A BANDPASS SIGNAL

BACKGROUND OF THE INVENTION

The invention relates generally to radio frequency receivers, and more particularly to circuits for sampling and converting received bandpass signals to numerically quantified equivalents.

Sampling circuits, consequently, constitute interfaces between front-end analog signal stages and back-end digital signal processor stages of state-of-the-art radio receivers. Digital Signal Processor (DSP) operations have become essential to modern radios, especially in implementing modem functions of these radios. Radio receivers which use digital signal processing techniques include those that use digital modulations, like PSK, as well as those that use analog modulations, like AM and FM. Until recently, all modem functions were performed by analog circuitry.

VLSI technology and the deployment of communications satellites have concurrently spawned a rather rapid development of digital radio communications technology. Digital communications technology includes digital information encoding or modulation, and conversely, decoding or demodulation, of carrier frequencies with signalling techniques known, among others, as phase shift keyed (PSK) or differential phase shift keyed (DPSK) signalling.

The basic processing techniques to convert an RF analog signal received at an antenna, through frequency downconversion, to a digital baseband signal are generally well understood and used. However, the techniques used in the existing art for downconversion and sampling functions generally demand comparatively costly components. In order for digital communications to penetrate large consumer market segments, as would be desirable for mobile satellite and digital cellular services, innovations in the radio art are required not only to improve performance, as has been the trend in the past, but also to reduce the cost of radios.

It is therefore highly desirable to implement known signal digitization and down conversion processes in more economical and more readily manufacturable apparatus than has been provided by the complex prior art apparatus and methods.

SUMMARY OF THE INVENTION

It is therefore an object of the invention to provide a simple and efficient arrangement for generating complex baseband samples of a bandpass signal.

It is a further object of the invention to generate through a digital circuit, separate and distinct from a DSP, a digital, zero-IF, complex baseband equivalent of a bandpass signal.

It is another object of the invention to perform complex baseband sampling of a bandpass signal, using a single A/D converter, and without using a digital signal processor for performing any of the operations necessary for generating a digital, zero-IF, complex baseband equivalent of the sampled bandpass signal.

It is yet a further object of the invention to provide an arrangement for, and method of, concurrent quadrature downconversion and input sampling of a bandpass signal.

In accordance with the invention, an arrangement for generating a digital, downconverted complex baseband signal from a bandpass signal comprises a signal source for providing first and second timing signals, or clock signals, at first and second clocking rates, respectively. The first clocking rate is at four times the expected nominal, or center, frequency of the bandpass signal, and the clocking rate of the second clocking signal is at a subharmonic frequency of the nominal bandpass frequency. The bandpass signal is sampled twice at the first clocking rate during each clocking period of the second clock signals. A subharmonic frequency is any frequency which, when quantitatively expressed and divided into the quantitatively stated nominal frequency of the bandpass signal, yields an integer.

BRIEF DESCRIPTION OF THE DRAWINGS

The Detailed Description of the Invention follows a Discussion of Existing Art Related to the Invention, all described for a better understanding of the invention in reference to the accompanying figures of drawing wherein:

FIGS. 1 through 6 refer to illustrations relating to the discussion of the prior art; and FIGS. 7 through 12 refer to and illustrate features of the present invention; and particularly.

DISCUSSION OF EXISTING ART RELATED TO THE INVENTION

Digital processing of analog signals implies prior time sampling and amplitude quantization of the analog signals to generate a digital equivalent of the analog signals. The digital equivalent of the analog signals may then be transferred to a Digital Signal Processor (DSP) to be processed. According to state-of-the-art digital techniques for extracting intelligent information from a signal, various techniques have been used which are now briefly described.

It is well known that a complex baseband representation of a carrier signal bears the same information about the carrier as its analytical signal, i.e., there is no useful information in the value of the IF itself. The "baseband" representation refers to an equivalent analytical representation of an IF signal at 0 Hz. The term "complex" denotes that both an In-phase or "I" component and a quadrature (90 degree phase shift) or "Q" component of the signal are present, hence, the signal is complex when it has both I and Q components. It is known and understood in the art that many, if not most, DSP operations on a digitized signal may be more efficiently performed on a complex baseband signal than when the signal is in a real form. Consequently, such a digitized complex baseband signal representation is desirably made available to a DSP prior to the execution of algorithms intended to extract information, such as encoded data, from the signal. Alternatively, DSP algorithms may be used to perform, or complete, the conversion from real to complex baseband form, loading the DSP with ancillary pre-processor operations.

Figure 1:
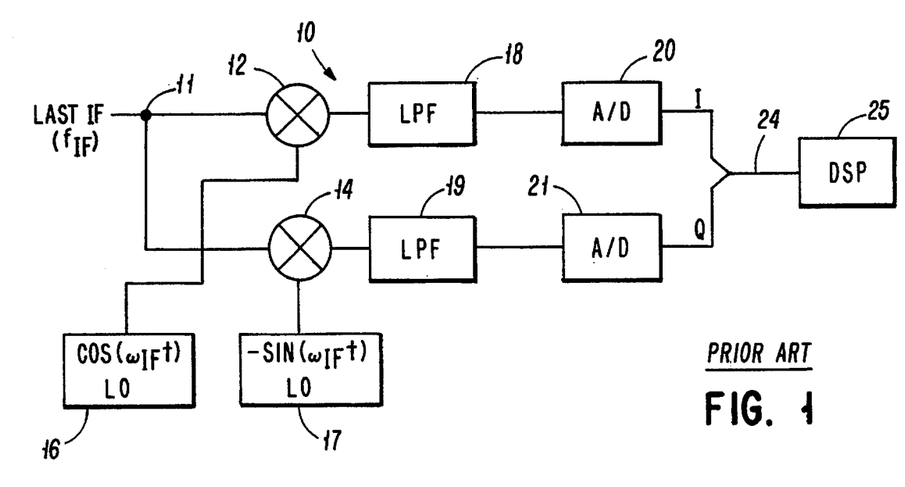
FIG. 1 shows a block diagram of a prior art signal downconversion and sampling technique.

FIG. 1 shows a block diagram of a traditional signal downconversion and sampling technique. In a conventional analog circuit 10, an IF signal is applied via a branching node 11 to respective multiplying mixers 12 and 14. At the mixers 12 and 14, the IF signal is multiplied by respective quadrature local oscillator signals, $\cos(\omega_{IF}t)$ 16 and $-\sin(\omega_{IF}t)$ 17, both at a frequency which is identical to the IF frequency, but at a 90 degree relative phase relationship. The resulting I and Q signals, after passing through respective lowpass filters 18 and 19, are applied to two low speed or "slow", analog to digital (A/D) converters 20 and 21, respectively. Sampling the I and Q signals with the two A/D converters 20 and 21 yields a complex baseband signal in the discrete-time domain. Downconverted and digitized complex baseband (I and Q) signals are transferred from the analog and digital sampling circuit 10 via a digital data bus 24 to a digital signal processor (DSP) 25 for further processing operations.

Figure 2A:
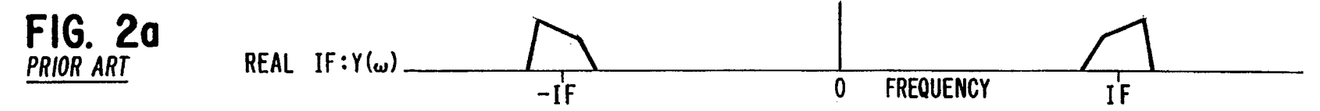
FIGS. 2a–2g shows spectra in prior art downconversion and sampling operations that are representative of the signal processing element shown in FIG. 1.
Figure 2B:
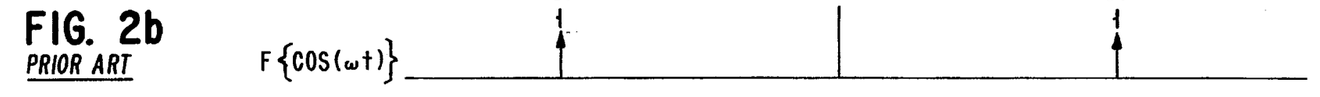
Figure 2C:
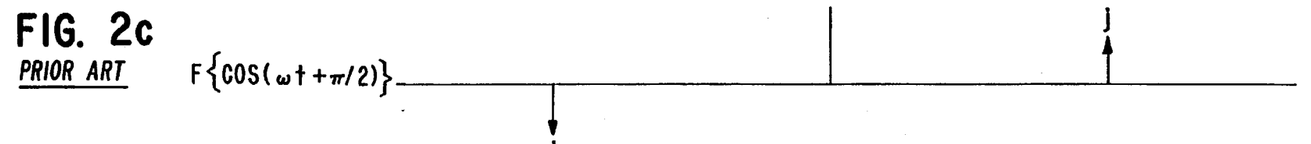

FIGS. 2a–2g show spectra in the conventional down conversion and sampling operations that are representative of the signal processing elements shown in FIG. 1. FIG. 2a represents a real, as opposed to a complex, signal spectrum of a typical IF signal. As is well known in the art, the real signal spectrum characteristically displays an even symmetry about a baseband 0 Hz frequency axis, having an exact mirror image of a positive IF spectral component at the corresponding negative IF frequency. FIGS. 2b and 2c show the spectra of the I and Q local oscillator signals, respectively, as generated by the local oscillators 16 and 17 (see FIG. 1). It is well understood in the art that continuous wave signals, such as the respective sine and cosine waveforms, are represented by impulse functions in the frequency domain.

Figure 2D:
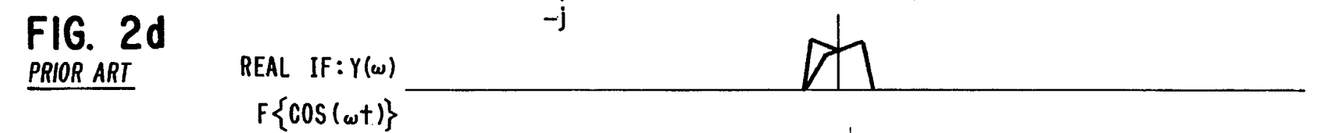
Figure 2E:
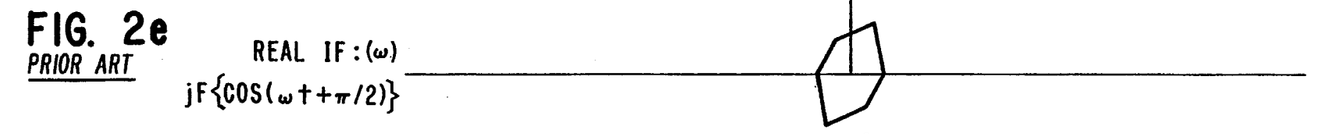
Figure 2F:
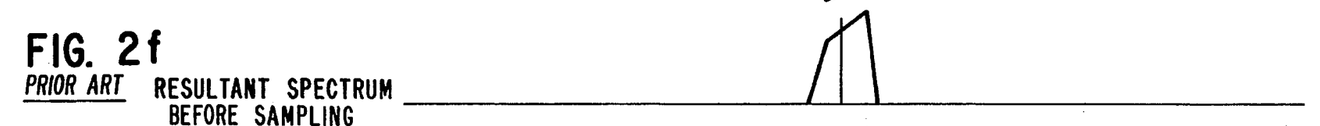

In reference to FIG. 1 and FIGS. 2d and 2e, the trace in FIG. 2d depicts the spectrum of the output signal of the I-mixer 12 which multiplies the IF and the function $\cos(\omega_{IF}t)$ with each other. FIG. 2e shows the trace which represents the output of the Q-mixer 14, premultiplied by (j). Mathematical operations on complex numbers with real and imaginary terms, wherein (j) is the square root of (−1), are readily performed by a DSP, as is well understood in the art. FIGS. 2d and 2e show a symbol (*) which is used to indicate convolution in the frequency domain, resulting in the respective spectra. Correspondence of convolution in the frequency domain and multiplication in the time domain is a well known fact in communications theory. Since a complex baseband signal is synonymous with the sum of I and jQ components of a signal downconverted to a zero center frequency, the summing of the spectra shown in FIGS. 2d and 2e results in the spectrum of the complex baseband equivalent of the IF signal. FIG. 2f represents a complex baseband spectrum as a sum of the spectra shown in FIGS. 2d and 2e. The summation cancels out the contribution of the negative frequency component of Y(ω) while enhancing the contribution of the corresponding positive frequency component, resulting in an asymmetrical baseband spectrum which is possible only when the time-domain signal is complex.

Figure 2G:
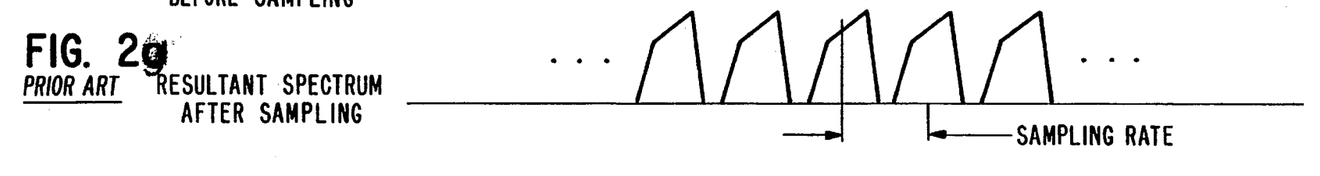

Sampling the complex baseband signal with the two A/D converters 20 and 21, as shown in FIG. 1 produces the desired spectrum shown in FIG. 2g. The spectrum shown in FIG. 2g is simply the repetition, at the sampling rate, of the baseband spectrum shown in FIG. 2f. The digitized signals of FIG. 2f are the desired starting signals from which information can now be extracted by further processing operations of the DSP 25. The described signal sampling process is used in various state-of-the-art digital radios. Recognized disadvantages of the sampling circuit 10 are that a comparatively large number of discrete analog components are called for. Moreover, for the sampling circuit 10 to function satisfactorily, all components thereof are subject to stringent gain and phase-shift matching requirements.

Figure 3:
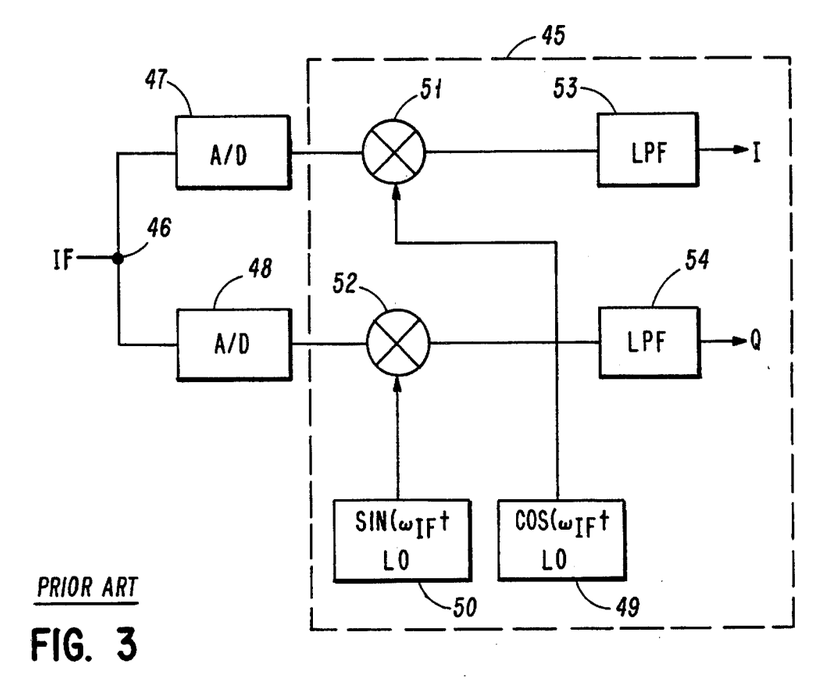
FIG. 3 shows a sampling circuit which transfers analog functions described with respect to FIG. 1 to a digital signal processor.

The disadvantages of the traditional sampling technique described with respect to FIG. 1 are well recognized and, more recently, other sampling techniques have become known in the art. FIG. 3 shows a sampling circuit 44 which transfers the analog functions described with respect to FIG. 1 to a digital signal processor 45 (DSP) to be performed as digital signal processing functions by the DSP 45. As shown in FIG. 3, an IF signal is applied via an input node 46 to first and second A/D converters 47 and 48. Sampled outputs of the first and second A/D converters 47 and 48 are further processed within the DSP 45. All signals within the DSP 45 are in a discrete-time domain. Digitized representations of the $\cos(\omega_{IF}t)$ and the $\sin(\omega_{IF}t)$ local oscillator signals (49 and 50, respectively), representable as impulse signals of a magnitude of (−1) and (1), are applied to respective digital I-mixer and Q-mixer functions 51 and 52. Output signals pass through respective digital lowpass I and Q filter functions 53 and 54 to yield digitized complex baseband signals, as represented by I and Q. The resulting digital downconversion function has the disadvantage of loading the DSP 45 with functions that are ancillary to the core functions as, for example, signal demodulation. As a consequence, a greater processing speed and memory become necessary. A greater processing speed and memory may be obtained from a more complex and, hence, more costly DSP 45, or by using more than a single DSP.

Figure 4:
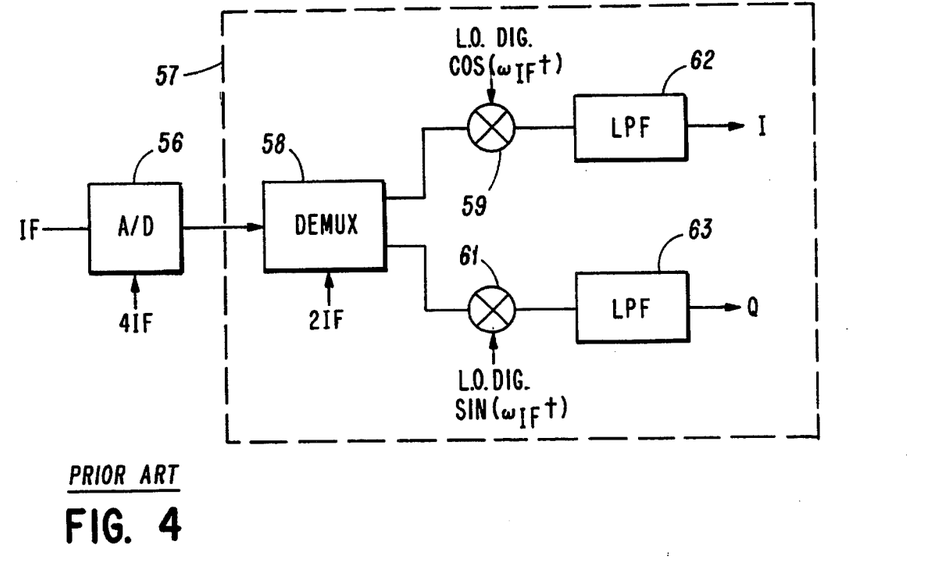
FIG. 4 shows a simplified sampling circuit of the prior art.

FIG. 4 shows further prior art, which is a simplification of the prior art depicted in FIG. 3. The simplification lies in the use of a single A/D converter 56 which samples the IF signal at four times the nominal IF (4·IF). The 4·IF sampling rate is twice that of the normally required minimum sampling rate known as the Nyquist rate. By using the 4·IF sampling rate, the sampled result produces alternate In-phase and Quadrature component samples of the sampled signal. The digital samples of the IF signal are now processed further by a digital signal processor 57 or, more generally, as a digital signal processing function by one or more digital signal processors, designated generally by the numeral 57. The sampled values are processed through a digital de-multiplexer function 58 which is clocked at the 2IF rate, or one-half of the initial sampling rate, such that sampled values are sent alternately to an I-mixer function and to a Q-mixer function 59 and 61, respectively. The I-mixer and Q-mixer functions are, again as the sampling and down conversion circuit in FIG. 3, digital functions which would be implemented by the digital signal processor function 57. At the I-mixer and the Q-mixer the demultiplexed I and Q components of the sampled IF are multiplied by respective $\cos(\omega_{LO}t)$ and $\sin(\omega_{LO}t)$ signals at the local oscillator frequency. The functions $\cos(\omega_{LO}t)$ and $\sin(\omega_{LO}t)$ may be represented simply by their sampled values of (+1) and (−1). The digital mixer output signals are, as described with respect to FIG. 3, passed through respective digital lowpass filters 62 and 63, yielding the complex baseband signal represented by I and Q which may now be further processed by the digital signal processing function 57. As with respect to the sampling and down conversion technique described with respect to FIG. 3, the described sampling and down conversion technique depicted in FIG. 4 tends to further load the digital processor domain with substantial ancillary operations, increasing the DSP cost even further.

Figure 5:
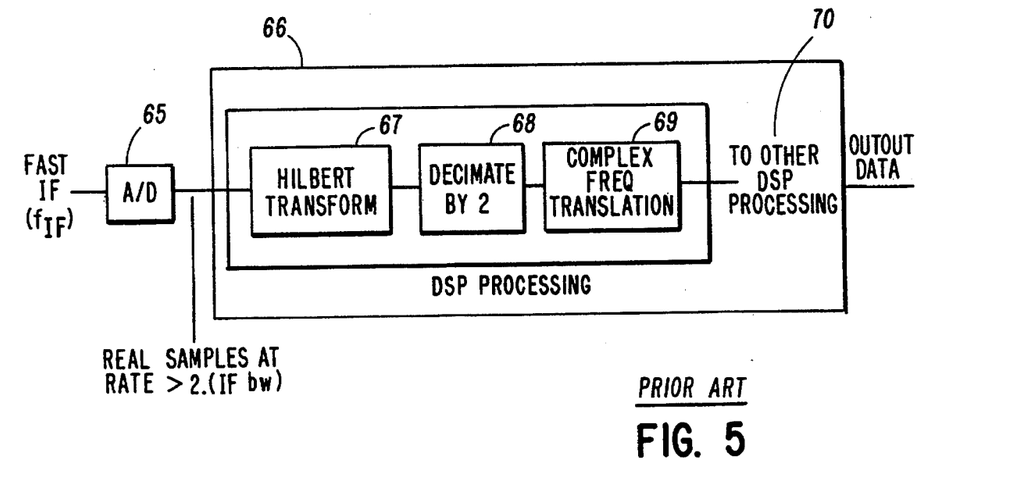
FIG. 5 shows a prior art sampling and downconversion technique which has been used in state-of-the-art digital radios.

FIG. 5 shows a recent prior art sampling and downconversion technique which has been used in state-of-the-art digital radios. The technique illustrated in FIG. 5 is unrelated to the sampling and downconversion approaches described with respect to FIGS. 3 and 4. Similarly to the earlier described technique shown in FIG. 4, FIG. 5 depicts an IF signal being sampled by sampled as a real signal by a single A/D converter 65. As in the prior arrangements described with respect to FIGS. 3 and 4, the functions of obtaining the complex baseband form of the sampled signal are shifted into the domain of digital signal processing, designated by a digital signal processing function block 66, which may represent one or more digital signal processors 66. FIGS. 6a through 6f show spectra in real bandpass sampling and, in further reference to FIG. 5, illustrate this latter known example of prior-art sampling and down conversion of an IF signal to a complex baseband signal. The latter example shows that what is known in the art as aliasing can be used as a technique for down conversion of a signal provided a proper sampling rate is chosen which avoids overlap of aliased spectra. Avoidance of spectral overlap is possible with bandpass signals and permits the A/D converter 65 to be used as a digital mixer 65.

Figure 6A:
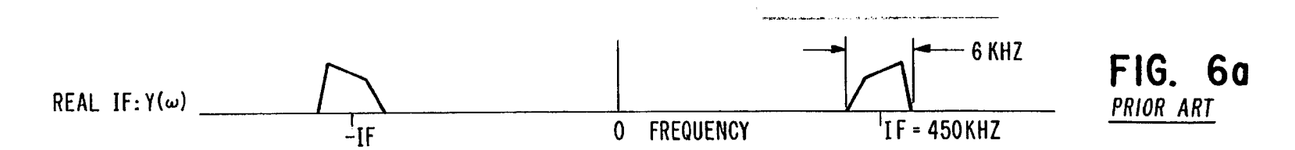
FIGS. 6a–6f shows spectra in real prior art bandpass sampling.
Figure 6B:
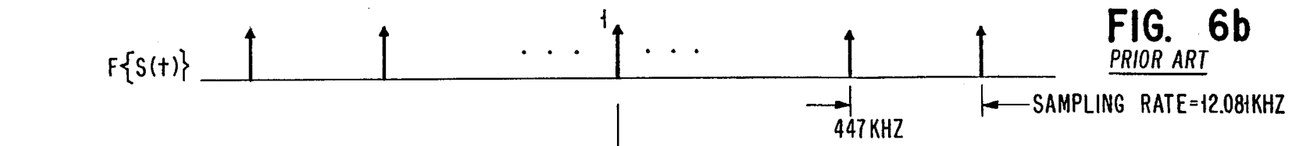
Figure 6C:
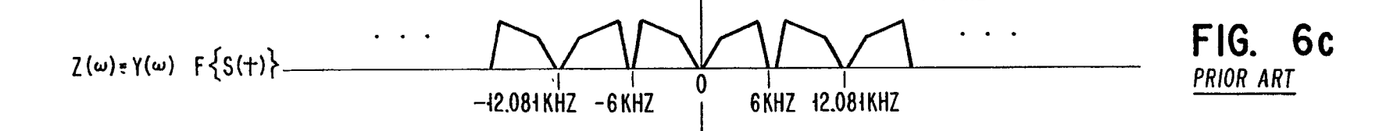

FIG. 6a shows a real IF signal spectrum Y(ω) having a center frequency of 450 kHz and a (stop) bandwidth of 6 kHz. Sampling the signal at a frequency of 12.081 kHz (see FIG. 6b) creates a component at audio frequency (spectrum occupancy of 0 to 6 kHz), with a center frequency of 3 kHz, as shown in FIG. 6c. This result is no different than a signal obtained by mixing the IF signal with a real local oscillator signal of 447 kHz (which is approximately equivalent to a 37th harmonic of 12.081 kHz), and which is subsequently lowpass filtered to a 6 kHz bandwidth and then sampled at 12.081 kHz. It must be noted in reference to FIG. 6c that the signal has not been downconverted to true baseband (center frequency of 0 Hz) but to a low audio IF of 3 kHz. The signal cannot be translated to a lower center frequency without causing spectral overlap with the negative frequency component (image) of the real IF spectrum. Further digital processing of the sampled real, audio-IF signal within the digital signal processing function 66 yields the desired complex baseband form of the signal. The further processing steps ancillary to the DSP core function are as follows.

Figure 6D:
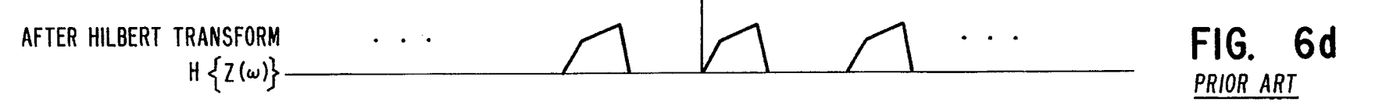
Figure 6E:
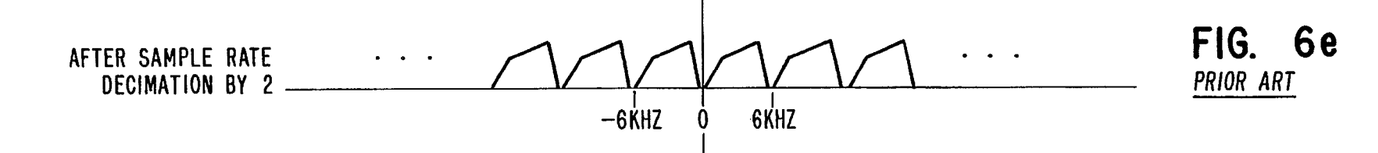
Figure 6F:
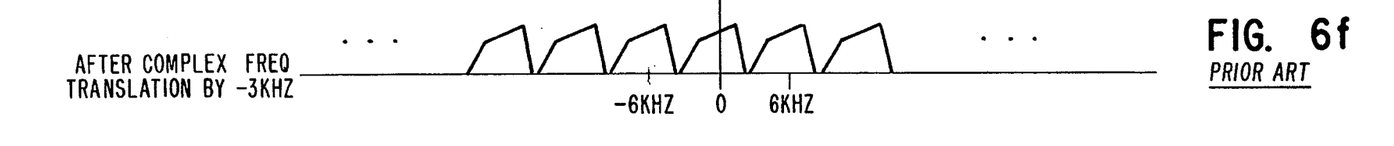

A well known digital signal processing operation, referred to in the art as a Hilbert transform 67 (see FIG. 5), suppresses the negative-frequency spectrum (0 to −6 kHz) of the baseband component shown in FIG. 6c, as well as the aliased versions of the (0 to −6 kHz) spectrum. The result of the spectra after the Hilbert transform 67 is shown in FIG. 6d. Time decimation by a factor of two, identified by numeral 68, yields the spectra shown in FIG. 6e, packing the spectra with a 6 kHz (6.04 kHz to be exact) repetition rate. A complex downconversion function 69 ultimately yields the desired complex baseband signal as shown in FIG. 6f. The complex baseband signal is then subjected to further processing shown as 70, such as the core function of digital signal processing, including typically demodulation of data. The increased complexity of digital processing over and above that required for signal demodulation is well demonstrated by the above description.

DETAILED DESCRIPTION OF THE INVENTION

Figure 7:
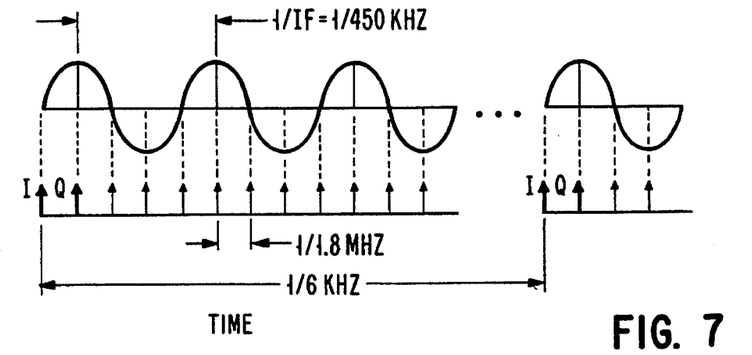
FIG. 7 shows a timing diagram of a continuous waveform and a sequence of composite timing signals in accordance with the invention.

In contrast to the known examples of the previously described prior art, the present invention is described in reference to FIGS. 7 through 11, wherein FIG. 7 shows an immediate distinction over the described known art.

As a preferred embodiment of the present invention, FIG. 7 shows a simple timing diagram of a bandpass waveform, such as a 450 kHz IF signal having a period of 1/IF or 1/450 kHz, and a bandwidth that is small relative to 450 kHz. The signal is being sampled at a low subharmonic rate. A subharmonic rate, as the term is used herein, defines a rate which is an exact submultiple of the sampled signal. Thus, a rate of 6 kHz, for example, divided into the IF of 450 kHz, yields seventy-five, an integer, making 6 kHz a subharmonic of 450 kHz. Sub-Nyquist sampling was used in the prior art example described with respect to FIGS. 5 and 6. Subharmonic sampling according to the prior art processes would have led to spectral overlap and, hence, signal distortion. Thus, the prior art did not and could not have used a subharmonic sampling rate, as in the present invention. A further distinction over prior sampling techniques become apparent by characteristic double sampling-pulse clusters, with an intra-cluster time spacing that is an inverse of four times the nominal IF, i.e., a phase-quadrature sampling rate, which corresponds to 1.8 MHz in the representative, preferred example. Significantly, the double-pulse clusters, though timed to yield an In-phase component (I) and a quadrature component (Q) of the sampled signal, occur as a discrete, composite single event during each sub-Nyquist, subharmonic sampling period. The sampling sequence, according to the invention, consequently, is characterized by a non-uniform time sampling rate wherein time spacing of sampling pulses alternates or switches between phase-quadrature spacing and relatively much greater time spacing, as determined by the exact subharmonic sampling frequency of the IF at which the sampling events occur. Referred to herein as a composite sampling process, the process uses a double-pulsed sampling event or operation, with two sampling pulses at phase-quadrature time-spacing. Moreover, a single set of two phase-quadrature sampling pulses occurs only once during each composite sampling period, with the sampling period being chosen to be a sub-Nyquist and an exact subharmonic of the sampled bandpass signal. The composite and complex, sub-Nyquist and subharmonic sampling directly yields the desired complex baseband samples without further need for digital processing.

Spectra pertaining to composite, sub-Nyquist and subharmonic complex sampling are illustrated in FIGS. 8a–8f. Though not essential for understanding the embodiments of the present invention, the mathematical considerations below are believed to be helpful in comprehending the theory of operation of these embodiments.

It is to be realized that a complex repetitive sampling pulse, s(t), may be represented by $$s(t) = \Delta(t-nT) + j\Delta(t - 1/(4 \cdot IF) - nT)$$

where, $\Delta(t-\tau)$ represents an impulse function occurring at time $\tau$; and T is the sampling period.

The complex pulse train s(t) is derived from the real sequence of dual pulses, illustrated in FIG. 7, by assigning the first pulse of a pair to the I component and the second pulse to the Q component. That is $$Re\{s(t)\} = I(t) = \Delta(t-nT)$$

$$Im\{s(t)\} = Q(t) = \Delta(t-1/(4 \cdot IF) - nT)$$

A representation of s(t) in the frequency domain is similar to that of a real sampling pulse, except for the complex amplitude, i.e.

$$\begin{aligned} S(f) = \quad & F\{s(t)\} \\ & (1-j1)\Delta(f-nf_s) \text{ for } f > 0 \\ & (1+j1)\Delta(f-nf_s) \text{ for } f < 0, \end{aligned}$$

$F_s$ = $1/T$, the sampling frequency,

= $IF/n$, where $n$ is an integer for subharmonic sampling.

The expression for S(f) shown above follows from the time-delay rule of Fourier transforms:

$$F\{x(t-\tau)\} = F\{x(t)\} \cdot \exp(-j\omega\tau).$$

Figure 8A:
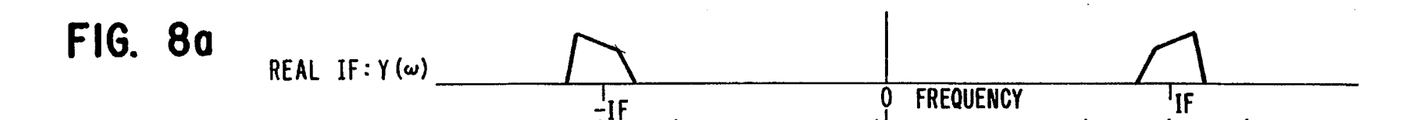
FIG. 8 shows signal spectra pertaining to sub-Nyquist, subharmonic complex signal sampling in accordance herewith.
Figure 8B:
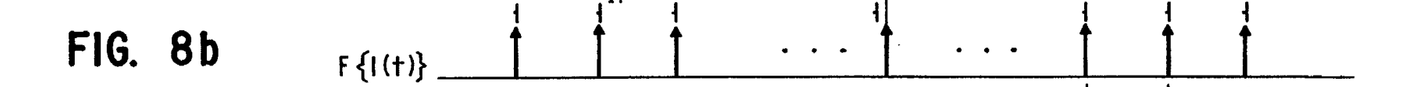
Figure 8C:
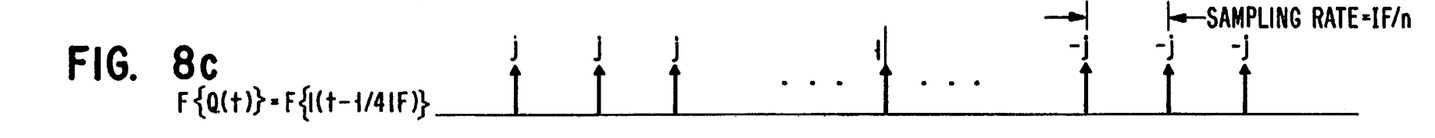
Figure 8D:
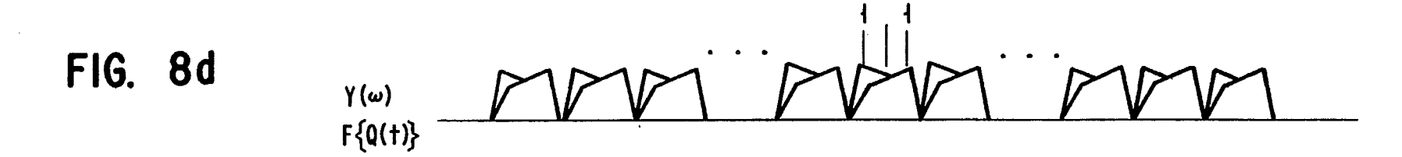
Figure 8E:
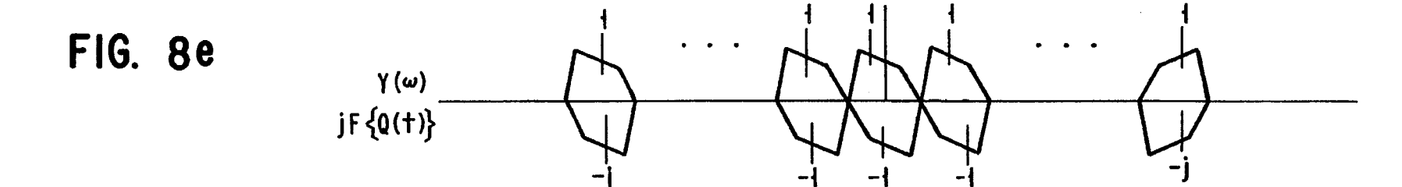

The result of convolution between S(f) and the IF signal spectra are shown in FIGS. 8a through 8f, wherein FIG. 8a shows characteristic spectrum of a real bandpass signal $Y(\omega)$, in the described example the referred-to IF signal. FIG. 8b shows the spectrum of I(t), the real part of s(t) while FIG. 8c shows the spectrum of Q(t), the imaginary part of s(t). FIG. 8d represents the result of convolution between the IF spectrum, $Y(\omega)$, and the spectrum of I(t). FIG. 8e depicts the convolution between $Y(\omega)$ and the spectrum of Q(t), premultiplied by (j) to form the complex spectrum. Thus, $$\begin{aligned} Z(\omega) \quad & = Y(\omega) * S(\omega) \\ & = Y(\omega) * [F\{I(t)\} + jF\{Q(t)\}] \end{aligned}$$

where $Z(\omega)$ is the resultant complex baseband spectrum, $Y(\omega)$ is the IF spectrum, and $F\{.\}$ designates a Fourier transform.

Figure 8F:
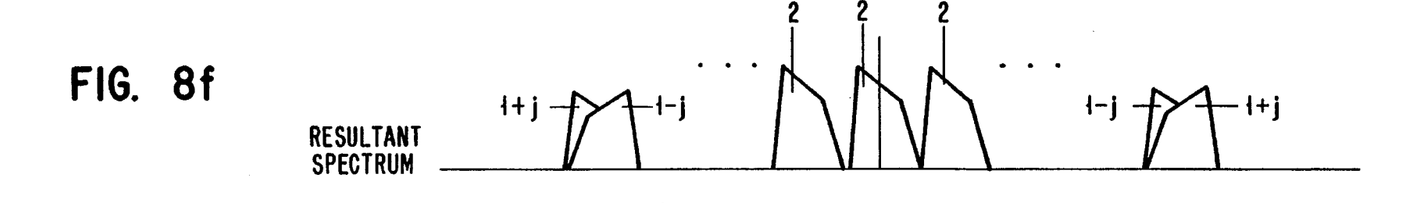

It is to be noted that convolution in the frequency domain between two functions is equivalent to reversal of the frequency axis of one function, followed by cross-correlation between the two functions. Since convolution is known to be a linear process, the spectra of FIGS. 8d and 8e are additive to obtain a resultant spectrum as shown in FIG. 8f.

In the above-described arrangement for achieving phase quadrature through time delay, a phase error does occur, which is insignificant as long as the ratio of the IF bandwidth divided by IF is significantly less than one. The phase error is equal to $(\pi/2)(B/IF)$, where B is the single-sided IF bandwidth, i.e., half the width of the IF passband. The phase error creates an in-band interference image with an amplitude of approximately the sine of the phase error. Thus, for an IF signal of 450 kHz and a passband of +/-3 kHz, a corresponding phase error at the band edge of 3 kHz amounts to 0.6 degrees and a corresponding self-interference equals approximately 20 log sine of the phase error, or -40 dBc. Such a level of self-interference is considered acceptable in applications of low signal to noise ratios at a detection end. Mobile data communications systems in general, and mobile satellite communications systems in particular, fall into the category of such low signal to noise ratio systems.

Figure 9:
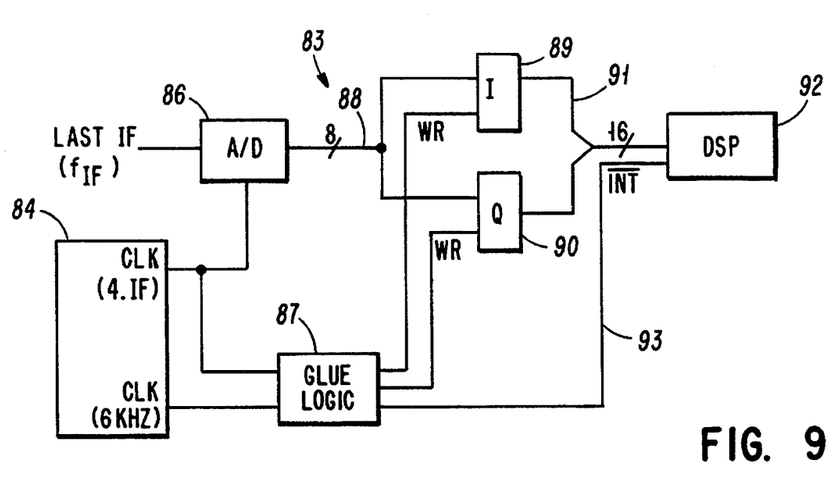
FIG. 9 is a block diagram showing a preferred sampling circuit assembly including features of the present invention.

Referring now to FIG. 9 there is shown a block diagram of a preferred A/D converter circuit 83 for a sub-Nyquist, subharmonic complex downconversion of a bandpass signal to baseband (0 Hz center frequency). The A/D converter circuit 83 uses timing signals from a local timing signal source 84, which timing signals bear a relationship to an expected nominal frequency of the bandpass signal to be operated on. The local timing signal source 84 should be understood to be collectively a source of at least first and second clock signals at first and second distinct signal rates, as further described herein. It is well known that frequencies of received RF signals tend to vary from a nominal frequency for any of a number of reasons, including, for example doppler shifts and local oscillator drifts. As was described above, frequency variations with respect to an expected nominal frequency of the bandpass signal will be tolerable as long as the desired signal is within the IF passband, i.e., has a frequency error less than +/-B Hz. A bandpass signal which, in the described example, is referred to as a final IF signal, is applied as an input signal via a signal input port to an analog-to-digital converter or A/D converter 86. The A/D converter 86 is one referred to in the art as a "fast" A/D converter because its performance must be adequate for sampling at four times the IF. A first timing signal supplied by the local timing circuit 84 is a sampling clock signal for the A/D converter 86. The generated first timing signals are time-spaced at intervals of an inverse of a signal rate of four times the IF ($1/4 \cdot IF$). In a specific example, of the IF signal having a frequency of 450 kHz, the sampling clock, applied to a timing port of the converter 86, generates periodic sampling pulses at a rate of 1.8 MHz. The 1.8 MHz pulse rate constitutes a quadrature sampling pulse rate for the 450 kHz IF signal as described with respect to FIG. 7. As shown in FIG. 9, the 1.8 MHz timing signal further becomes the clock for a logic circuit 87, also referred to as glue logic 87. A second timing or clock signal supplied by the timing source 84, for complex sampling of the IF signal at a true subharmonic frequency, 6 kHz in the example, is also provided to the glue logic 87. Data sampled by the A/D converter 86 at the 1.8 MHz clocking rate are applied via an 8-bit bus 88 to two 8-bit signal latches which are respectively designated as an I-latch 89 and a Q-latch 90. However, it is the glue logic 87 which controls the events in time during which the sampled values are actually written to (locked into) the I-latch 89 and the Q-latch 90. In accordance herewith, the glue logic 87 issues only one I-latch write command and only one Q-latch write command during each timing cycle, or timing period, of the 6 kHz clock, which timing cycle becomes the actual sampling cycle for combined quadrature downconversion and input sampling in accordance herewith. Significantly, the Q-latch write command lags in time behind the I-latch write command by one timing cycle or period of the 1.8 MHz clock signal, so that the glue logic 87 generates a double-pulsed, complex sampling command which is time-spaced by intervals of an inverse of the sampling rate of 6 kHz (1/6 kHz). Because of the double sampling pulses, spaced in time by 1/1.8 MHz, each composite, complex sampling period of 1/6 kHz seconds generates digital data for a complex baseband representation of the IF signal. It is, consequently, the combination of only the glue logic 87 and the I-latch 89 and Q-latch 90, which generates in a simple manner, a true digital complex baseband representation of the IF signal, using the digital samples generated by the A/D converter 86.

Although both I and Q signal components are channeled via the bus 88 to both the I-latch 89 and the Q-latch 90, the write signals of the referred-to glue logic 87 enable the I-latch 89 to latch in the In-phase samples, while the Q-latch write signals, delayed by a $(1/1.8) \times 10^{-6}$ sec., latch in the quadrature samples. The I and Q samples latched into the respective I-latch 89 and Q-latch 90 are then written via a 16-bit data-out bus 91 (including 8 data bits from each of the latches 89 and 90) to a digital signal processor 92 (DSP) at the subharmonic sampling rate of 6 kHz. A 6 kHz DSP interrupt signal by the glue logic 87 via a signal line 93 coupled to the DSP, causes the DSP 92 to read the sampled data at the I and Q data latches 89 and 90. According to the described, preferred embodiment, the write to the Q-latch 90 and the interrupt to the DSP 92 occur simultaneously. However, the DSP 92 has a finite interrupt service time which equates to a distinct response delay by the DSP 92. Therefore, the finite interrupt service time of the DSP 92 ensures that the I and Q data are latched in the respective I-latch 89 and the Q-latch 90 before the I and Q data are read by the DSP 92.

It should be realized that the described A/D converter circuit 83 supplies the DSP with a true digital-complex-baseband equivalent of the IF signal. No further signal conversion operations are required by the DSP 92 prior to its core operations of acquiring and demodulating the received signal to extract received data or communications. The operations within the digital domain, in the present example the DSP 92, are therefore relieved of the processing-intensive steps of generating the downconverted digital complex baseband signal, as had been the practice in certain prior art examples, as described above.

Figure 10:
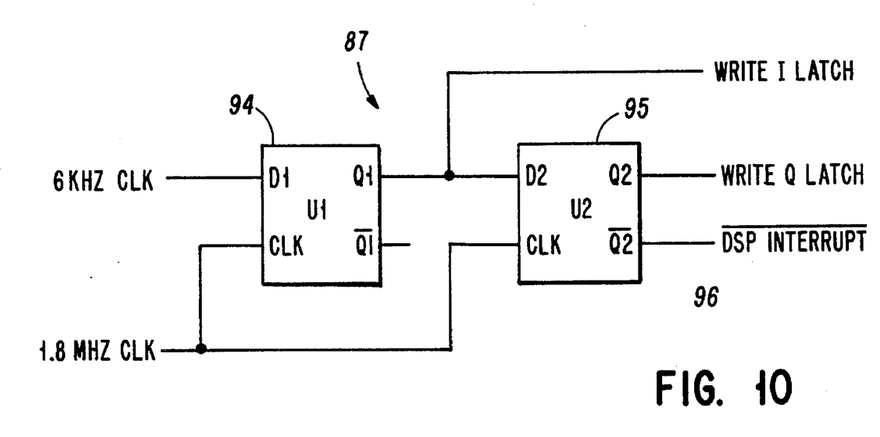
FIG. 10 shows details of interfacing logic circuits of the preferred sampling circuit assembly shown in FIG. 9.
Figure 11A:
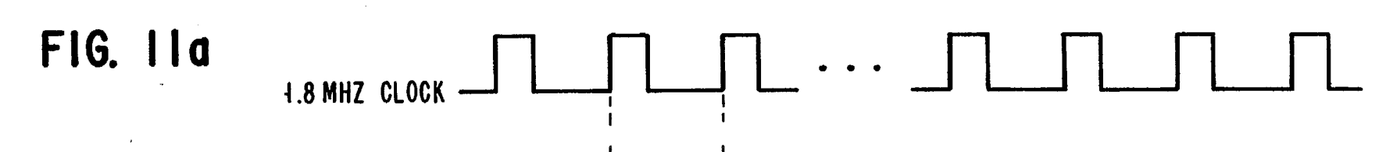
FIG. 11 is a timing diagram pertaining to the operation of the sampling circuit of FIG. 9.
Figure 11B:
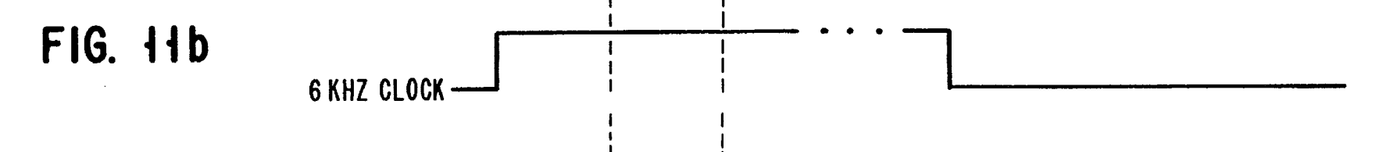
Figure 11C:
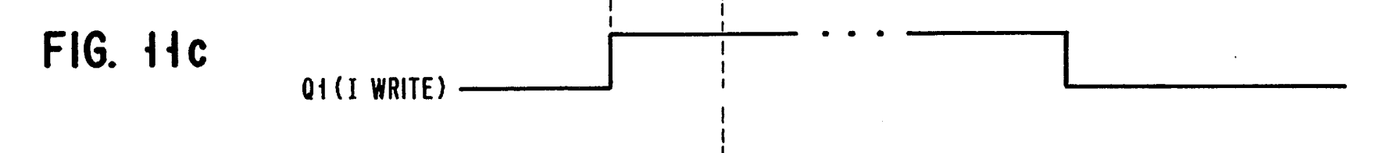
Figure 11D:
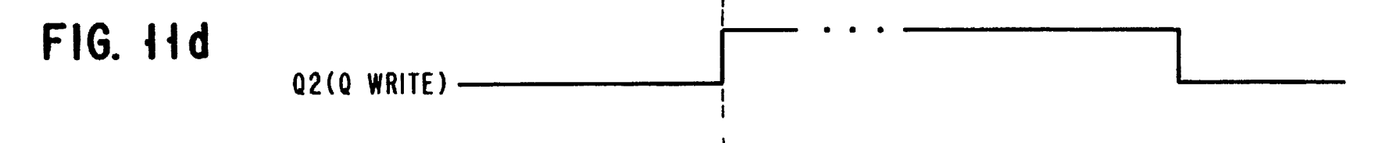
Figure 11E:
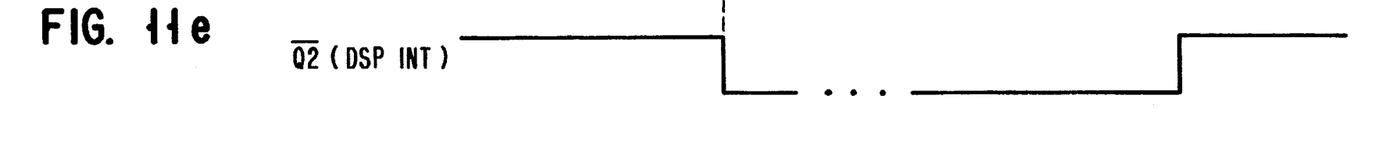

In reference to FIGS. 10 and 11, FIG. 10 depicts a preferred arrangement for implementing the glue logic circuit 87, while FIG. 11 shows a timing diagram of graphs "a" through "e" with timing sequences for latching the In-phase and Quadrature sampling events and transferring the sampled data to the DSP 92 (of FIG. 9). First and second D-type flip-flop circuits 94 and 95 (U1 and U2, respectively) are both clocked at respective clock ports (CLK) by the 1.8 MHz (4*IF) signal (graph a). The 6 kHz signal (graph b) is applied to a D1 input port or terminal of the first flip-flop circuit 94, and the Q1 output port or terminal of the circuit 94 is coupled to the D2 input data port or terminal of the flip-flop circuit 95. The rising edge of the Q1 output also represents the write command (graph c) to the positive-edge triggered I-latch 95 (shown in FIG. 9), which is delayed by a one timing period of the 1.8 MHz clock with respect to 6 kHz timing signal (graph b). The Q2 output is coupled as the write command (graph d) to the positive-edge triggered Q-latch 95 (of FIG. 9), showing an added delay of one 1.8 MHz clock cycle, hence of 1/4 IF with respect to the Q1 write command (graph c).

During an operational sequence of the described A/D converter circuit 83 (see FIG. 9), and more particularly the logic circuit 87 (see FIGS. 9 and 10), Q1 goes positive on the first positive transition of the 1.8 MHz clock after D1 goes positive. Q2 goes positive on the first transition of the 1.8 MHz clock signal after Q1 goes positive, as Q1 is connected to D2. Both the I-latch 94 and the Q-latch 95 are positive edge triggered, as mentioned above. An interrupt signal is generated at the inverse Q2, or not-Q2, output port and applied at 96 to the digital signal processor 92, which is negative-edge triggered. The interrupt request service time is sufficiently long to avoid any timing contention between writing and reading the Q-latch 95.

Referring back to FIG. 9, it is to be realized that the disclosed circuit 83 may be implemented either by discrete logic circuits, wherein the A/D converter 86 is a separate device and the glue logic 87 is comprised of various, separate glue logic chips, or by integrated logic functions, combining, for example, A/D and glue logic functions in a single device 83. It is also possible for the DSP 92 and the converter circuit or input sampling circuit 83 to be integrated into a single mixed-signal Application Specific Integrated Circuit (ASIC), wherein the described composite, complex sampling technique is expected to contribute to a circuit simplification of a resulting ASIC.

It should be realized that the use of downconverted complex baseband signals applies to many, if not most, digital processing techniques used in digital radios, as well as in non-radio applications using digital signal processing. Prominent non-radio applications to which the present invention may advantageously apply are radar, direction finding and position location, automotive applications and robotics. Thus, of significance is the generation of the digital complex baseband signal representation of a sampled analog signal in the manner and by the arrangements described herein, rather than the application of the digital complex baseband signal to any one particular digital signal processor.

Figure 12:
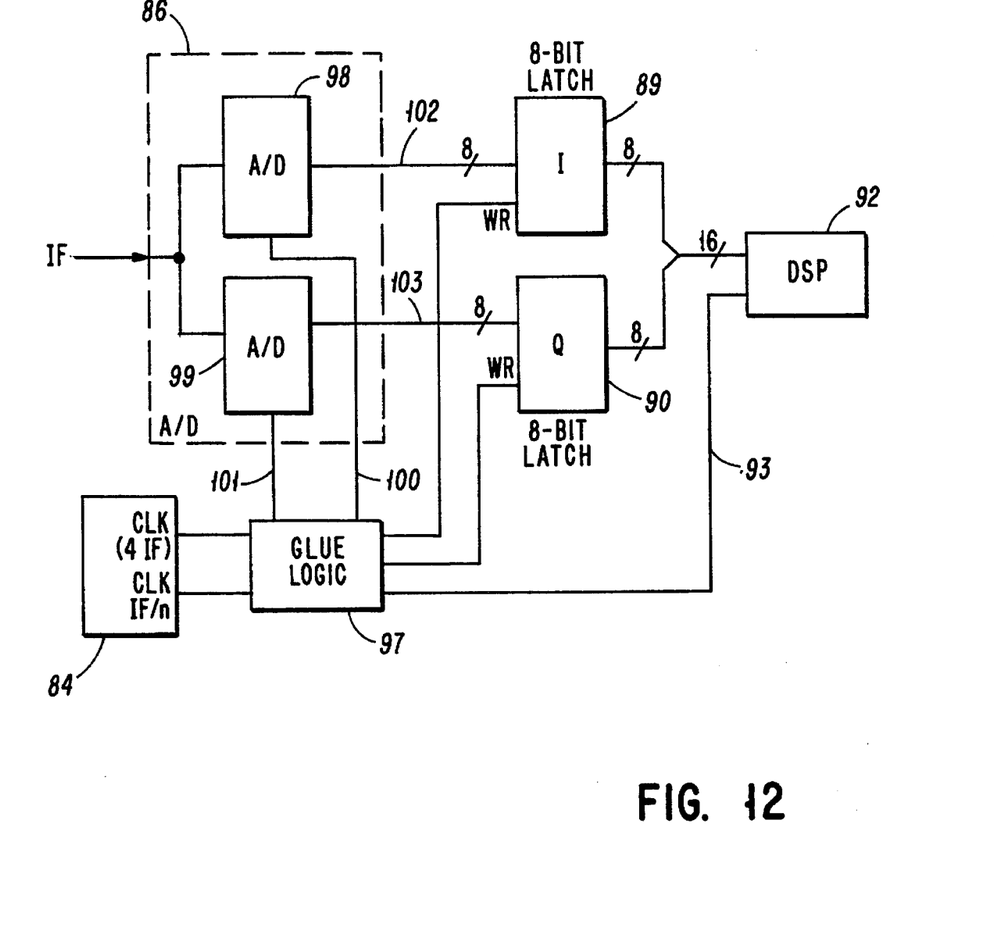
FIG. 12 is a block diagram showing contemplated modifications as alternate embodiments of the preferred sampling circuit assembly shown in FIG. 9.

Keeping in mind that the downconverted complex baseband signal of the bandpass signal is obtained sampling with a composite, phase-quadrature double-pulse sampling event at a true subharmonic sampling rate of the frequency of the bandpass signal, various modifications and alternative implementations within the scope of the invention come to mind. FIG. 12 shows, for example, an alternative to the converter circuit 83 of FIG. 9, according to which the A/D converter 86, instead of being coupled to continuous phase-quadrature timing signals, is driven by a glue logic circuit 97. The glue logic circuit 97 is operated by the timing circuit 84, the timing circuit 84 supplying first timing signals at a phase-quadrature rate and second timing signals at a true subharmonic of the input IF signal, shown as a clock rate of IF divided by an integer "n" (IF/n). In response, the glue logic 97 generates, as described above with respect to the glue logic 87, the described composite, complex timing sequence consisting of a phase-quadrature double-pulse burst of timing signals at a true subharmonic rate (IF/n) of the IF signal. Thus, instead of being operated at a steady rate of phase-quadrature pulses at four times the IF, as described with respect to FIG. 9, the A/D converter 86 would now sample in bursts, i.e., at a composite sample pulse rate with a single phase-quadrature or complex double-pulse sampling event or operation occurring at a selected subharmonic rate of the IF. The A/D converter 86 would take two samples in rapid succession (time-spaced at a phase-quadrature interval, i.e., 4·IF), then remain idle for the remainder of the subharmonic sampling period. The sampled, digital output from the A/D converter 86 appears simultaneously, as described above with respect to FIG. 9, at both the I-latch 89 and the Q-latch 90, but concurs in time with the respective write commands to the I-latch 89 and to the Q-latch 90. The I and Q data are, consequently, latched into the respective I-latch 89 and Q-latch 90 on occurrence of the respective I-write and Q-write signals. The latched data are sampled by the DSP 92 at the subharmonic sampling rate in accordance with an interrupt applied via the signal line 93.

The alternative embodiment in FIG. 12, of pulsing the A/D converter 86 with at a composite double pulse rate of four times the bandpass signal frequency (4·IF) but at the comparatively much slower subharmonic rate of second alternate example, suggests a further cost-saving simplification, illustrated also with respect to FIG. 12. Accordingly, the single A/D converter 86 is replaced by first and second A/D converters 98 and 99, respectively. The first A/D converter 98 is pulsed with a sampling pulse being the first of the described double pulses via an I-signal line 100, while the second A/D converter 99 is pulsed with a sampling pulse being the second of the double pulses via a Q-signal line 101 (In case of the single A/D converter 86, both of the double pulses are applied to the same timing port of the A/D converter 86). The first A/D converter 98 applies the sampled output solely to the I-latch 89 via data bus 102, while the second A/D converter 99 applies the sampled output solely to the Q-latch 90 via data bus 103. Sampled data are written to the I and Q latches 89 and 90, as previously described, in response to respective I-write and Q-write signals from the glue logic 97, which occur on completion of the respective I and Q sampling operations, and are applied via respective write signal lines 104 and 105. The interrupt signal applied via the interrupt signal line 93 causes the DSP 92 to read the latched I and Q samples from the respective I and Q latches 89 and 90 via data bus 106. The use of 8-bit latches for the I and Q data latches 89 and 90, and the use of respective 8- and 16-line data buses into the latches 89, 90 and into the DSP 92, respectively, corresponds to a preferred word length for a digital representation of the sampled signal, and should be regarded as illustrative and not as limiting the scope of the invention. Though the first and second A/D converters 98 and 99 in the latter example may need to be matched in performance, a distinct advantage is obtained in that each of the A/D converters 98 and 99 are now operated at the comparatively slow sampling rate of IF/n, a subharmonic of the input bandpass signal frequency, which allows slow and comparatively inexpensive A/D converters to be selected to function effectively in the described embodiment. The use of the slow sampling rate in each of the A/D converters 98 and 99 further implies sampling bandpass signals at comparatively higher frequencies, opening the way to eliminating a downconversion stage of input frequencies.

As will be realized from the above detailed description, all of the embodiments therein are illustrative and are specific examples of apparatus and methods pursuant to the invention. Various changes and modification to the described apparatus may be made in view of the above description without departing from the spirit and scope of the invention which is defined by the claims below.

What is claimed is:

1. A sampling circuit for concurrent quadrature downconversion and input sampling of a bandpass signal comprising:

means for generating first timing signals time-spaced by an inverse of a first timing signal rate of four times a center frequency of the bandpass signal;

means for generating second timing signals time-spaced by an inverse of a second timing signal rate, the second timing signal rate being a subharmonic rate of the center frequency of the bandpass signal; and means for sampling the bandpass signal at the second timing signal rate with a single set of composite, phase-quadrature double pulses, the double pulses being time-spaced by the inverse of the first timing signal rate.

2. The circuit according to claim 1, wherein the means for sampling the bandpass signal comprises:

A/D converter means for generating digital samples of the bandpass signal in response to sampling pulses applied to the A/D converter means;

a first data latch, coupled to the A/D converter means, for latching in the generated digital samples of the bandpass signal in response to and at the time of a first write command applied to the first data latch;

a second data latch, coupled to the A/D converter means, for latching in the generated digital samples of the bandpass signal in response to and at the time of a second write command applied to the second data latch;

glue logic means, coupled to the means for generating first timing signals and to the means for generating second timing signals, for generating a composite timing sequence of first and second timing pulses time-spaced by the inverse of the first timing signal rate and repeated at a rate of the inverse of the second timing signal rate, and for generating and applying first and second write commands to the first and second data latches, respectively, the first and second write commands being time-spaced by the inverse of the first timing signal rate; and means for applying sampling pulses to the A/D converter means, the sampling pulses being time-spaced by the inverse of the first timing signal rate.

3. The circuit according to claim 2, wherein the means for applying sampling pulses comprises means for coupling the means for generating first timing signals to the A/D converter means and the sampling pulses are applied continuously.

4. The circuit according to claim 2, wherein the means for applying sampling pulses comprises means for coupling the glue logic means to the A/D converter means and the sampling pulses comprise two pulses time-spaced by the inverse of the first timing signal rate, the two pulses occurring as a composite sampling event time-spaced by the inverse of the second timing signal rate.

5. The circuit according to claim 1, wherein the means for sampling the bandpass signal comprises:

A/D converter means, coupled to the means for generating the first timing signals, for generating digital samples of the bandpass signal at the first timing signal rate;

first and second data latches, coupled to the A/D converter means, for latching in the generated digital samples of the bandpass signal in response to and at the time of a write command applied to the first and second data latches, respectively;

control means, coupled to the means for generating first timing signals and to the means for generating second timing signals, and further coupled to the first and second data latches for applying a first pulse of the set of double pulses as a first data latch write command to the first data latch, and applying a second pulse of the set of double pulses as a second data latch write command to the second data latch.

6. The circuit according to claim 5, wherein the first and second data latches are coupled to a digital signal processor, and wherein the control means further comprises means for generating a latch read control signal upon having applied the first and second pulses of the set of double pulses to the respective first and second data latches, the latch read control signal being applied to the digital signal processor to cause the digital signal processor to read the digital samples latched in the first and second data latches.

7. The circuit according to claim 5, wherein the control means comprises first and second D-type flip-flop circuits, a data port D1 of the first D-type flip-flop circuit being coupled to the means for generating first timing signals, an output port Q1 of the first flip-flop circuit being coupled to the first data latch and to an input data port D2 of the second D-type flip-flop circuit, clocking ports of the first and the second D-type flip-flop circuits being coupled to the means for generating second timing signals, an output port D2 of the second flip-flop circuit being coupled to the second data latch, and a not-Q2 output port of the second flip-flop circuit being coupled to an interrupt port of a digital signal processor.

8. A method of generating a digital, downconverted complex baseband signal from a bandpass signal of an expected center frequency comprising:

generating first timing signals at a first rate of four times the frequency of the expected center frequency of the bandpass signal;

generating second timing signals at a second rate of a true subharmonic frequency of the expected center frequency of the bandpass signal; and sampling the bandpass signal at the second rate of the second timing signals and with a composite double pulse event having a single occurrence of a first sampling pulse and a second sampling pulse time-spaced by an inverse of the first rate of the first timing signals.

9. The method according to claim 8, wherein the bandpass signal is an IF signal at an expected center frequency of 450 kHz, and wherein:

generating first timing signals comprises generating timing signals at a first rate of 1.8 MHz, and generating second timing signals comprises generating timing signals at a second rate of 6 kHz.

10. The method according to claim 8, wherein sampling the bandpass signal comprises:

sampling the bandpass signal by a single A/D converter successively at the first rate of the first timing signals to generate successive, digital samples of the bandpass signal at phase-quadrature intervals;

applying the digital samples of the bandpass signal to simultaneously to first and second data latches; and at timed intervals in accordance with the second rate of the second timing signals and on occurrence of the first sampling pulse, sending a write command to the first data latch and then, on occurrence of the second pulse, sending a write command to the second data latch.

11. The method according to claim 10, further comprising sending a read command to a digital signal processor circuit upon the occurrence of the second sampling pulse.

12. The method according to claim 8, wherein sampling the bandpass signal comprises:

sampling the bandpass signal by a single A/D converter with a double pulse time-spaced by the inverse of the first rate of the first timing signals to generate In-phase and Quadrature samples of the bandpass signal;

repeating the double pulse sampling at the second rate of the second timing signals; and writing the In-phase samples to a first data latch and the Quadrature samples to a second data latch.

13. The method according to claim 12, further comprising sending a read command to a digital signal processor circuit upon writing the In-phase and Quadrature samples to the respective first and second data latches, to cause the digital signal processor circuit to read the respective samples as a digital, downconverted complex baseband signal of the bandpass signal.

14. The method according to claim 8, wherein sampling the bandpass signal comprises:

sampling the bandpass signal by a first A/D converter with a first pulse of a double pulse sampling event, the two pulses being time-spaced by the inverse of the first rate of the first timing signals, thereby generating an In-phase sample of the bandpass signal;

sampling the bandpass signal by a second A/D converter with a second pulse of the double pulse sampling event, thereby generating a Quadrature sample of the bandpass signal;

repeating the double pulse sampling event at the second rate of the second timing signals; and writing generated In-phase samples to a first data latch and generated Quadrature samples to a second data latch.

15. The method according to claim 14, further comprising sending a read command to a digital signal processor circuit upon writing generated In-phase and Quadrature samples to the respective first and second data latches, to cause the digital signal processor circuit to read the respective samples as a digital, downconverted complex baseband signal of the bandpass signal.

* * * * *